(12) United States Patent
Lee et al.

(10) Patent No.: US 11,166,351 B2
(45) Date of Patent: Nov. 2, 2021

(54) SOLDER REFLOW APPARATUS AND METHOD OF MANUFACTURING AN ELECTRONIC DEVICE

(71) Applicant: Samsung Electronics Co., Ltd., Suwon-si (KR)

(72) Inventors: Sin-Yeob Lee, Asan-si (KR); Dong-Woo Shin, Asan-si (KR); Hyun-Seok Choi, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 16/138,120

(22) Filed: Sep. 21, 2018

(65) Prior Publication Data

US 2019/0174584 A1 Jun. 6, 2019

(30) Foreign Application Priority Data

Dec. 6, 2017 (KR) .................. 10-2017-0166361

(51) Int. Cl.
*H05B 6/64* (2006.01)
*H01L 21/263* (2006.01)
(Continued)

(52) U.S. Cl.
CPC ......... *H05B 6/6447* (2013.01); *H01L 21/263* (2013.01); *H01L 21/324* (2013.01); *H01L 21/67115* (2013.01); *H01L 24/75* (2013.01); *H01L 24/81* (2013.01); *H01L 25/105* (2013.01); *H01L 25/50* (2013.01); *H05B 6/80* (2013.01);

(Continued)

(58) Field of Classification Search
None
See application file for complete search history.

(56) References Cited

U.S. PATENT DOCUMENTS 4,470,701 A * 9/1984 Smith .................. G01C 19/667
356/467
4,853,658 A 8/1989 Lane
(Continued)

FOREIGN PATENT DOCUMENTS

DE 102004017772 A1 * 11/2005 ........... H05K 3/3494
GB 2376201 * 12/2002 ........... G02B 6/3636
(Continued)

OTHER PUBLICATIONS

Liao, A Phase-Shifting Method for Improving the Heating Uniformity of Microwave Processing Materials, Published: Apr. 25, 2016, MDPI, www.mdpi.com/journal/materials, Materials 2016, 9, 309; doi:10.3390/ma9050309, (Year: 2016).*

*Primary Examiner* — Ibrahime A Abraham
*Assistant Examiner* — Gyounghyun Bae
(74) *Attorney, Agent, or Firm* — Muir Patent Law, PLLC

(57) ABSTRACT

In a method of manufacturing an electronic device, a solder paste is coated on a substrate pad of a substrate. An electronic product is disposed on the substrate such that a solder on an input/output pad of the electronic product makes contact with the solder paste. A first microwave is generated toward the solder paste during a reflow stage to heat the solder paste. A phase of the first microwave is changed during the reflow stage. Heating of the solder paste causes the solder to reflow, thereby forming a solder bump between the substrate pad and the input/output pad.

16 Claims, 8 Drawing Sheets

(51) Int. Cl.
*H01L 21/324* (2006.01)
*H01L 21/67* (2006.01)
*H01L 25/00* (2006.01)
*H01L 25/10* (2006.01)
*H05B 6/80* (2006.01)
*H01L 23/00* (2006.01)

(52) U.S. Cl.
CPC .............. *H01L 24/13* (2013.01); *H01L 24/16* (2013.01); *H01L 2224/13101* (2013.01); *H01L 2224/16225* (2013.01); *H01L 2224/755* (2013.01); *H01L 2224/7525* (2013.01); *H01L 2224/7598* (2013.01); *H01L 2224/75101* (2013.01); *H01L 2224/75272* (2013.01); *H01L 2224/8122* (2013.01); *H01L 2224/81024* (2013.01); *H01L 2224/81048* (2013.01); *H01L 2224/81096* (2013.01); *H01L 2224/81097* (2013.01); *H01L 2224/81098* (2013.01); *H01L 2224/81801* (2013.01); *H01L 2224/81948* (2013.01); *H01L 2924/1431* (2013.01); *H01L 2924/1434* (2013.01); *H01L 2924/1436* (2013.01)

(56) References Cited

U.S. PATENT DOCUMENTS

| | | | | |
|---|---|---|---|---|
| 4,967,172 | A | 10/1990 | Ariel et al. | |
| 5,716,663 | A * | 2/1998 | Capote | B23K 35/0222 156/277 |
| 5,988,487 | A * | 11/1999 | MacKay | H05K 3/3485 228/254 |
| 6,175,287 | B1 * | 1/2001 | Lampen | H01L 23/66 257/728 |
| 6,252,779 | B1 * | 6/2001 | Pierson | H05K 3/3436 361/774 |
| 6,286,206 | B1 * | 9/2001 | Li | C22C 1/1036 156/283 |
| 6,644,536 | B2 | 11/2003 | Ratificar et al. | |
| 7,043,109 | B2 * | 5/2006 | Kish, Jr. | G02B 6/12021 385/14 |
| 7,569,800 | B2 | 8/2009 | Tian et al. | |
| 7,628,871 | B2 * | 12/2009 | Suh | B23K 1/0016 148/403 |
| 7,985,657 | B1 * | 7/2011 | Budraa | H01L 21/187 438/455 |
| 8,796,843 | B1 * | 8/2014 | Babic | H01L 24/81 257/718 |
| 8,846,448 | B2 | 9/2014 | Chen et al. | |
| 9,018,110 | B2 | 4/2015 | Stowell et al. | |
| 9,258,850 | B2 | 2/2016 | Yoshikado et al. | |
| 10,211,141 | B1 * | 2/2019 | Fillion | H01L 23/49838 |
| 10,661,394 | B2 * | 5/2020 | Chu | B23K 35/0244 |
| 2001/0020545 | A1 * | 9/2001 | Eldridge | H05K 7/1069 174/260 |
| 2002/0104877 | A1 * | 8/2002 | Morimoto | H01L 24/81 228/224 |
| 2002/0110942 | A1 * | 8/2002 | Moghe | H01L 23/66 438/26 |
| 2003/0019917 | A1 * | 1/2003 | Furuno | B23K 1/206 228/246 |
| 2003/0170444 | A1 * | 9/2003 | Stewart | H01L 23/293 428/317.7 |
| 2005/0104792 | A1 * | 5/2005 | Asao | H01Q 13/103 343/767 |
| 2005/0133572 | A1 * | 6/2005 | Brese | H01L 24/81 228/180.22 |
| 2006/0201935 | A1 | 9/2006 | Nishikawa | |
| 2007/0228110 | A1 * | 10/2007 | Eldridge | H01L 21/67288 228/180.5 |
| 2010/0001744 | A1 * | 1/2010 | Hirayama | G01R 1/24 324/645 |
| 2010/0021736 | A1 * | 1/2010 | Slinker | H01L 21/4871 428/408 |
| 2011/0051375 | A1 * | 3/2011 | Ammar | H01L 25/16 361/728 |
| 2017/0055342 | A1 * | 2/2017 | Lam | H05K 1/141 |
| 2018/0331068 | A1 * | 11/2018 | Fukuoka | H01L 25/0652 |

FOREIGN PATENT DOCUMENTS

| | | |
|---|---|---|
| JP | 4839994 | 10/2011 |
| JP | 2013201096 | 10/2013 |
| KR | 10-1205839 | 11/2012 |

* cited by examiner

SOLDER REFLOW APPARATUS AND METHOD OF MANUFACTURING AN ELECTRONIC DEVICE

PRIORITY STATEMENT

This application claims priority under 35 U.S.C. § 119 to Korean Patent Application No. 10-2017-0166361, filed on Dec. 6, 2017 in the Korean Intellectual Property Office (KIPO), the contents of which are herein incorporated by reference in their entirety.

BACKGROUND

1. Field

Example embodiments relate to a solder reflow apparatus and a method of manufacturing an electronic device using the same. More particularly, example embodiments relate to a solder reflow apparatus using microwave and a method of manufacturing a semiconductor device using the same.

2. Description of the Related Art

In surface mount technology (SMT), a convection heating method may be used for soldering of a solder paste. However, great amounts of energy may be consumed, and heat deterioration failures may occur in an electronic product or a substrate due to a lot of heat. On the other hand, there is a heating method which vibrates molecules of a dielectric using a microwave. However, when the microwave having a fixed frequency is used, non-uniform heating phenomenon may be caused. Especially, electric charges may be concentrated on an edge or sharp portion, thereby causing sparks.

SUMMARY

Example embodiments provide a solder reflow apparatus capable of preventing a heat deterioration failure with uniform heating.

Example embodiments provide a method of manufacturing an electronic device using the solder reflow apparatus.

According to example embodiments, a method of manufacturing an electronic device includes: coating a solder paste on a substrate pad of a substrate; disposing an electronic product on the substrate such that a solder on an input/output pad of the electronic product makes contact with the solder paste; generating a first microwave toward the solder paste during a reflow stage to heat the solder paste; and changing a phase of the first microwave during the reflow stage, wherein heating of the solder paste causes the solder to reflow, thereby forming a solder bump between the substrate pad and the input/output pad.

According to example embodiments, a method of manufacturing an electronic device includes: printing a solder paste on a plurality of substrate pads of a substrate; forming solders on input/output pads of an electronic product respectively; disposing the electronic product on the substrate such that the solders are interposed between the input/output pad and the solder paste; generating a first microwave toward the solder paste during a reflow stage to heat the solder paste; and changing a phase of the first microwave during the reflow stage, wherein heating of the solder paste causes the solders to reflow, thereby forming a solder bump between the corresponding substrate pad and the input/output pad.

According to example embodiments, a method of manufacturing an electronic device includes: coating a solder paste on a substrate pad of a substrate; disposing an electronic product on the substrate such that a solder on an input/output pad of the electronic product makes contact with the solder paste; generating a first microwave toward the solder paste during a preheat stage to pre-heat the solder paste; generating a second microwave toward the solder paste during a reflow stage to heat the solder paste; and changing a phase of the second microwave during the reflow stage, wherein heating of the solder paste during the reflow stage causes the solder to reflow, thereby forming a solder bump between the substrate pad and the input/output pad.

According to example embodiments, in order to reflow a solder on a solder paste, a phase-shifted microwave of which a phase is shifted during a reflow process, may be emitted to selectively heat the solder paste, to reflow the solder. Accordingly, a substrate and an electronic product may be heated to a temperature relatively less than a heating temperature of the solder paste.

Accordingly, a heat deterioration failure may be prevented without using a low melting point solder, and heat vulnerable device and material may be used to decrease product costs.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

FIG. 1 is a cross-sectional view illustrating a solder reflow apparatus in accordance with example embodiments.

FIG. 2 is a block diagram illustrating the solder reflow apparatus in FIG. 1.

FIG. 4 is a cross-sectional view illustrating a reflow process with a microwave emitted by a microwave device in FIG. 1.

FIG. 5 is a graph illustrating a temperature profile over time of an object heated by the solder reflow apparatus of FIG. 1.

FIG. 6 is a flowchart illustrating a method of manufacturing an electronic apparatus in accordance with example embodiments.

FIGS. 7 to 11 are views illustrating a method of manufacturing an electronic device in accordance with example embodiments.

DETAILED DESCRIPTION OF EXAMPLE EMBODIMENTS

Hereinafter, example embodiments will be explained in detail with reference to the accompanying drawings.

Figure 1:
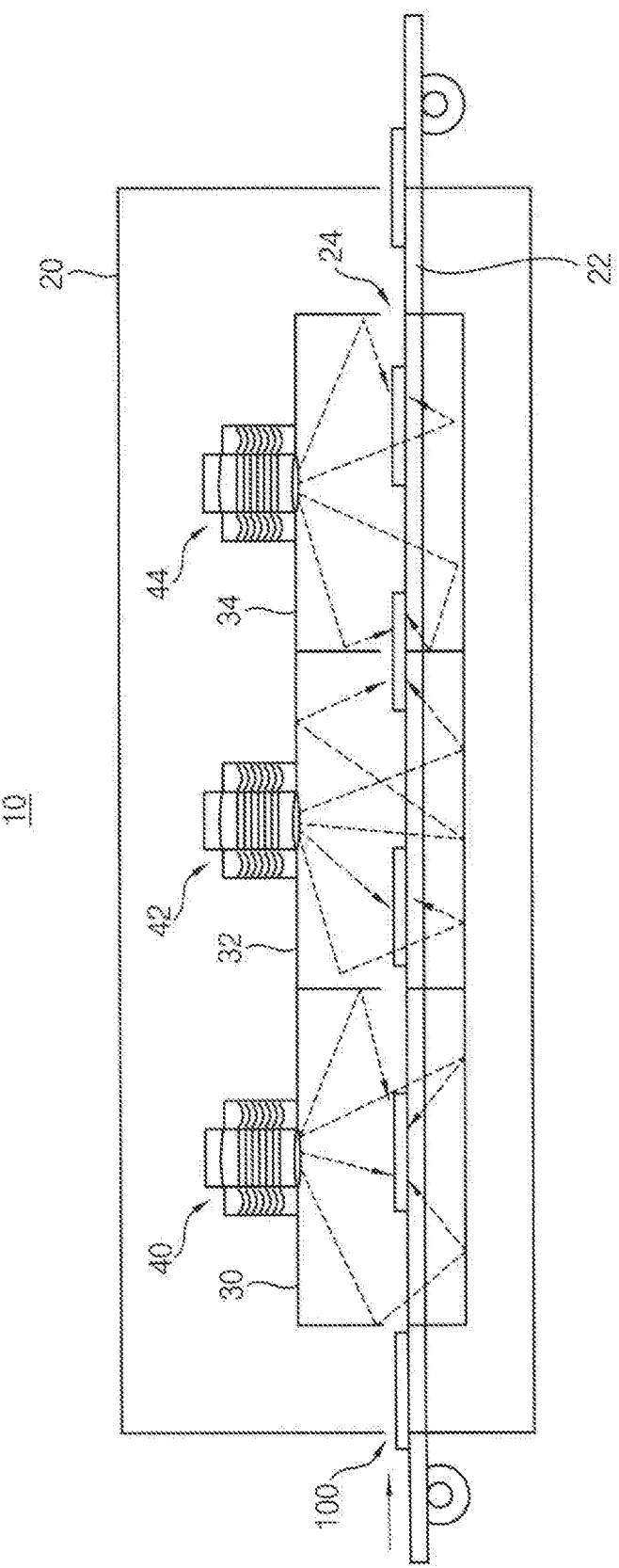
Figure 2:
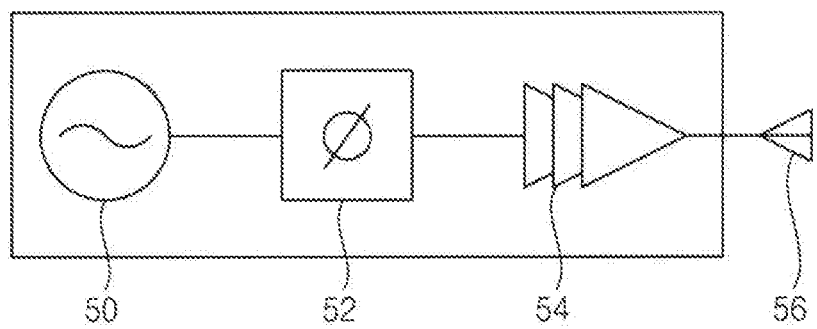
Figure 3A:
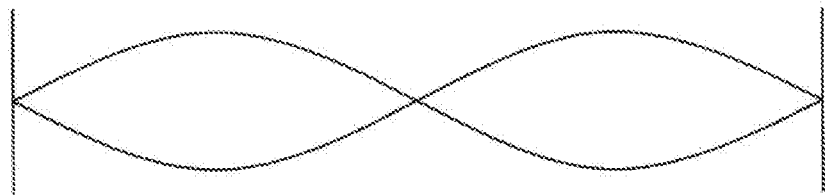
FIG. 3A is a view illustrating a waveform of a microwave generated by a microwave generator of a microwave device in FIG. 2
Figure 3B:
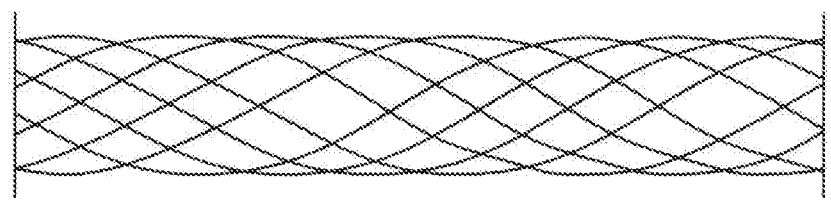
FIG. 3B is a view illustrating a modified waveform of a microwave by a phase shifter of the microwave device in FIG. 2.
Figure 4:
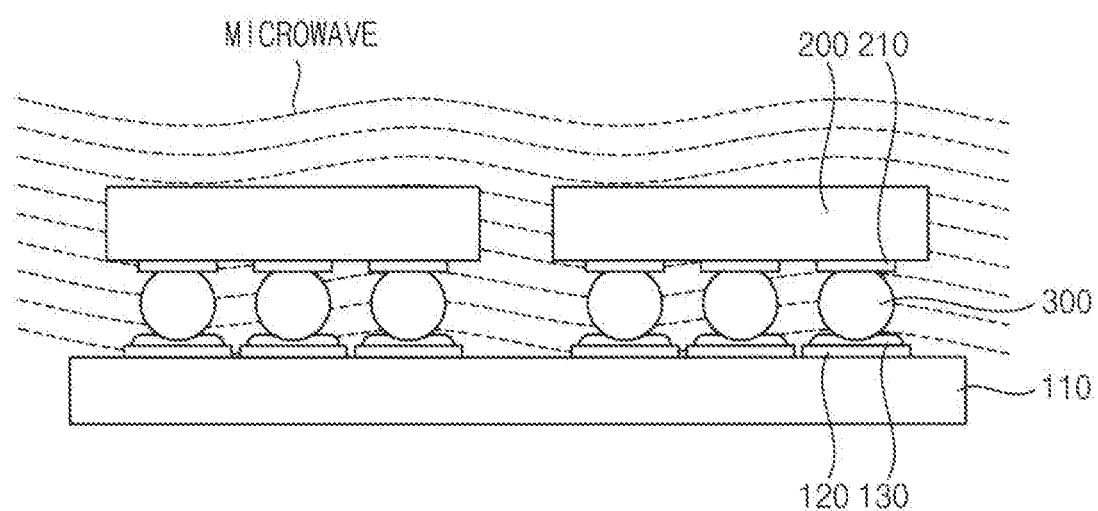
Figure 5:
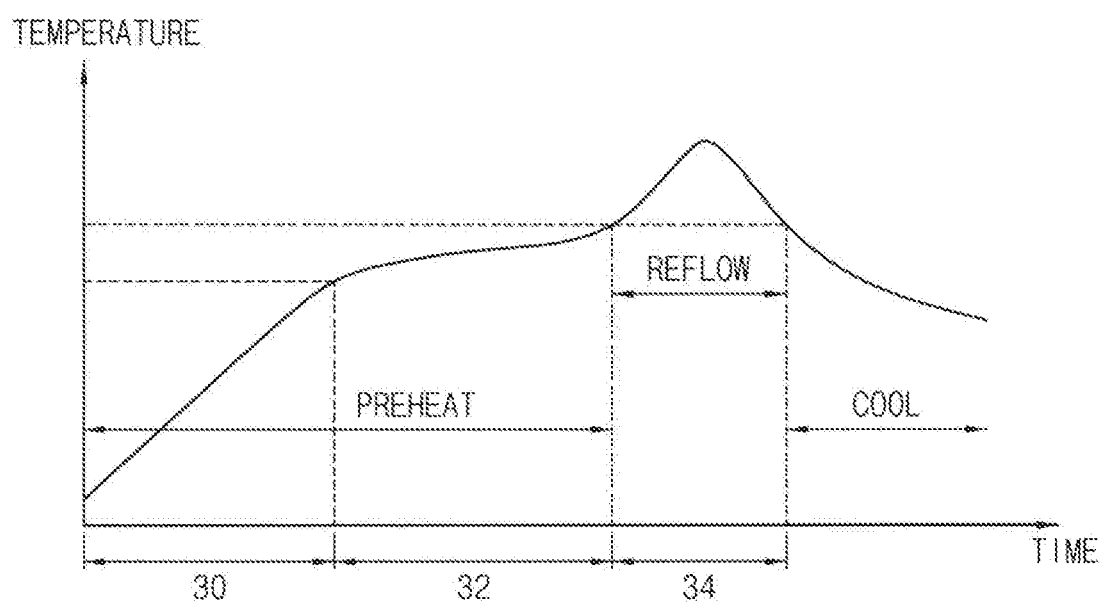

FIG. 1 is a cross-sectional view illustrating a solder reflow apparatus in accordance with example embodiments. FIG. 2 is a block diagram illustrating the solder reflow apparatus in FIG. 1. FIG. 3A is a view illustrating a waveform of a microwave generated by a microwave generator of a microwave device in FIG. 2 and FIG. 3B is a view illustrating a modified waveform of a microwave by a phase shifter of the microwave device in FIG. 2. FIG. 4 is a cross-sectional view illustrating a reflow process with a microwave emitted by a microwave device in FIG. 1. FIG. 5 is a graph illustrating a temperature profile over time of an object heated by the solder reflow apparatus of FIG. 1.

Referring to FIGS. 1 to 5, a solder reflow apparatus 10 may include at least one heating chamber, a substrate support configured to support an electronic device 100 within the heating chamber, and a microwave device installed within the heating chamber to generate a microwave.

In example embodiments, the solder reflow apparatus 10 may include first to third heating chambers 30, 32, 34 arranged sequentially within a reflow chamber 20 in a first direction (e.g., horizontal direction, x-direction). The first to third heating chambers 30, 32, 34 may be arranged in-line, and may be connected to each other through gates 24. The first and second heating chambers 30, 32 may be pre-heating chambers, and the third heating chamber 34 may be a reflow heating chamber for reflowing a solder. Thus, according to example embodiments, the third heating chamber 34 (i.e., the reflow heating chamber) is positioned at one end of the reflow chamber 20 and the first heating chamber 30 (i.e., the first pre-heating chamber) is positioned at the opposite end of the reflow chamber 20 and the second heating chamber 32 (i.e., the second pre-heating chamber) is positioned between the first heating chamber 30 and the third heating chamber 34.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

For example, sidewalls of the first to third heating chambers 30, 32, 34 may include a conductive material, e.g., metals (Cu, Al, etc.). The sidewalls of each of the heating chambers may define a resonant cavity. The cavity may be determined in consideration of energy absorption of the microwave.

The substrate support of the solder reflow apparatus 10 may include a conveyor belt 22. The conveyor belt 22 may be installed to extend in one direction through the first to third heating chambers 30, 32, 34. As the conveyor belt 22 moves in one direction, electronic devices 100 supported on the conveyor belt 22 may pass sequentially through the first to third heating chambers 30, 32, 34. In this exemplary embodiment, the conveyor belt 22 moves in the horizontal direction (x-direction) and the electronic devices 100 supported on the conveyor belt 22 may pass sequentially through the first to third heating chambers 30, 32, 34 in the horizontal direction. The electronic device 100 may be loaded/unloaded into/from the first to third heating chambers 30, 32, 34 through the gates 24 by the conveyor belt 22. Thus, while the electronic device 100 is moved from a first sidewall of the heating chamber to a second sidewall opposite to the first sidewall, a solder reflow process with a microwave may be performed on the electronic device 100.

According to example embodiments, the gates 24 may include openings in sidewalls of the first to third heating chambers 30, 32, and 34, and are configured such that the electronic device 100 supported by the conveyor belt 22 may pass through the first to third heating chambers 30, 32, 34 sequentially within the reflow chamber 20 and that heat generated within in one heating chamber may be substantially blocked from entering into another heating chamber. For example, the gates 24 are configured such that the heat generated in the first heating chamber 30 may substantially remain within the first heating chamber 30 and may not enter the second heating chamber 32, the heat generated in the second heating chamber 32 may substantially remain within the second heating chamber 32 and may not enter the first heating chamber 30 or the third heating chamber 34, and the heat generated in the third heating chamber 34 may substantially remain within the third heating chamber 34 and may not enter the second heating chamber 32.

The solder reflow apparatus 10 may include first to third microwave devices 40, 42, 44 which are installed in the first to third heating chambers 30, 32, 34 respectively to generate a microwave. As illustrated in FIG. 2, each of the first to third microwave devices 40, 42, 44 may include a microwave generator 50 configured to generate a microwave, a phase shifter 52 configured to change a phase of the microwave, an amplifier 54 configured to amplify the microwave, and a radiator 56 configured to radiate the amplified microwave into the heating chamber.

The microwave generator 50 may include a magnetron. The magnetron may be a power tube oscillator which converts an electric power into a radiofrequency (RF) power. Each microwave generator 50 may generate a microwave having a predetermined frequency. The frequency of the microwave may range from about 1 GHz to about 40 GHz. For example, each microwave generator 50 may generate a microwave having a predetermined power. The power of the microwave may range from about 100 W to about 6 kW, and in some embodiments, from about 100 W to about 3 kW.

The phase shifter 52 may include a phase shift circuit for changing the phase of the generated microwave. Alternatively, the microwave generator 50 may include a phase shift structure such as a diffuser for changing the phase of the microwave.

Each phase shifter 52 may shift the phase of the microwave at a predetermined phase shift value per unit time ($\Delta\varphi/s$). For example, the predetermined phase shift value per unit time ($\Delta\varphi/s$) may be at least $\pi/3$ rad/s. The phase shifter 52 may change the phase over time in stages or continuously.

The microwave emitted from the first to third microwave devices 40, 42, 44 may vibrate molecules of a dielectric to heat.

As illustrated in FIG. 3A, the microwave outputted from each microwave generator 50 may have a predetermined fixed frequency. When incident and reflected microwaves are in anti-phase, if the difference between the phases is relatively great, a non-uniform heating phenomenon may be caused. Especially, electric charges may be concentrated on an edge or sharp portion of the substrate or components of the substrate, thereby causing sparks.

As illustrated in FIG. 3B, the phase of the microwave outputted from the phase shifter 52 may be changed over time. Accordingly, an inflection point of the incident and reflected microwaves may be distributed uniformly. Thus, identical uniform energy may be generated across the entire region within the heating chamber, thereby causing uniform heating.

As illustrated in FIG. 4, the electronic device 100 loaded into each heating chamber may include a substrate 110 and an electronic product 200 stacked on the substrate 110 via a solder 300. A solder paste 130 may be coated on a substrate pad 120 of the substrate 110, and the solder 300 on an input/output pad 210 of the electronic product 200 may contact the solder paste 130. The term "contact," or "make contact with," as used herein, refers to a direct connection (e.g., touching).

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

For example, the electronic product 200 may include a semiconductor package, and the substrate 110 may include a module substrate. In this case, the electronic device 100 may be a semiconductor module. Alternatively, the electronic product 200 may include a semiconductor chip, and the substrate 110 may include a package substrate. In this case, the electronic product 200 may be a semiconductor package.

The solder paste 130 may include a solder powder and a flux. The flux may include a resin, a solvent, a plasticizer and an activator. When the flux is selectively heated by the microwave, the solder powder may be molten together.

Each microwave device (40, 42, 44) may output the phase-shifted microwave to the electronic device 100, to perform a reflow process of the solder 300. In particular, in the third chamber 34, the solder paste 130 as the dielectric may be selectively heated by the phase-shifted microwave, and then, the solder 300 may be molten to form a mechanical junction, for example, solder bump 310, to thereby mechanically and electrically connect the substrate pad 120 and the input/output pad 210.

As used herein, and unless indicated otherwise, items described as being "electrically connected" or "to electrically connect" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component.

In example embodiments, as illustrated in FIG. 5, the solder reflow apparatus 10 may include a plurality of the heating chambers arranged in-line, and may implement a desired heating temperature profile.

In particular, the first and second heating chambers 30, 32 of the first to third heating chambers 30, 32, 34 may be used as the pre-heat chamber, and the third heating chamber 34 may be used as the reflow heating chamber.

The first microwave device 40 may output a microwave having a first power to pre-heat the solder paste 130 to a first temperature, and the second microwave device 42 may output a microwave having a second power greater than the first power to pre-heat the solder paste 130 to a second temperature greater than the first temperature, and the third microwave device 44 may output a microwave having a third power greater than the second power to heat the solder paste 130 to a third temperature greater than the second temperature, to thereby perform a reflow process. For example, the third temperature may range from about 240° C. to about 260° C., the second temperature may range from about 100° C. to about 240° C., and the first temperature may range from about 60° C. to about 100° C.

The solder reflow apparatus 10 may further include a cooling chamber (not shown) adjacent to the third heating chamber 34. The cooling chamber may be maintained under a temperature less than the third temperature, to complete the reflow process.

Because only the solder paste 130 is selectively heated by each microwave device, the substrate 110 and the electronic product 200 may be heated to a temperature about 100° C. less than the heating temperature of the solder paste 130. Accordingly, a heat deterioration failure may be prevented without using a low melting point solder, and a heat vulnerable device and material may be used to decrease product costs.

Hereinafter, a method of manufacturing an electronic device using the solder reflow apparatus of FIG. 1 is explained. A case where the electronic device is a semiconductor module will be explained. However, it will be understood that the method of manufacturing an electronic device may not be limited thereto.

Figure 6:
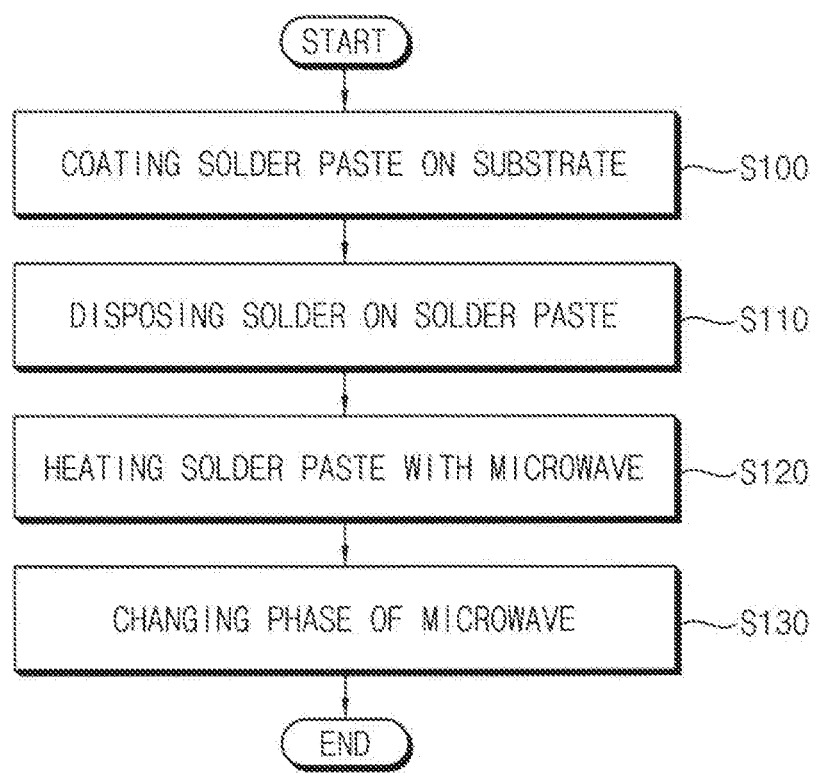

FIG. 6 is a flowchart illustrating a method of manufacturing an electronic apparatus in accordance with example embodiments. FIGS. 7 to 11 are views illustrating a method of manufacturing an electronic device in accordance with example embodiments.

Referring to FIGS. 6 to 9, first, a solder paste 130 may be coated on a substrate pad 120 of a substrate 110 (S100), a solder 300 may be disposed on the solder paste 130 (S110).

Figure 7:
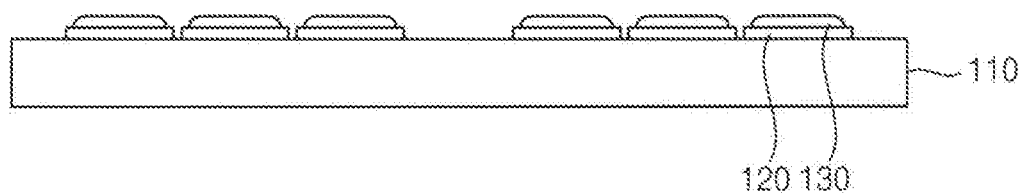

As illustrated in FIG. 7, the solder pastes 130 may be coated on a plurality of the substrate pads 120 of the substrate 110 respectively. For example, the substrate 110 may include a module substrate or a package substrate.

The solder paste 130 may be printed on the substrate pad 120 of the substrate 110. For example, the solder paste 130 may be printed by a stencil printer. The stencil may be a metal foil having a plurality of openings corresponding to arrangements of following solders. During printing of the solder paste, the solder paste 130 may be printed to fill the openings of the stencil. The solder paste 130 may include a solder powder and a flux. The flux may include a resin, a solvent, an antioxidant and an activator. When the flux is selectively heated by the microwave, the solder powder may be molten together and may be bonded with the substrate pad 120.

Figure 8:
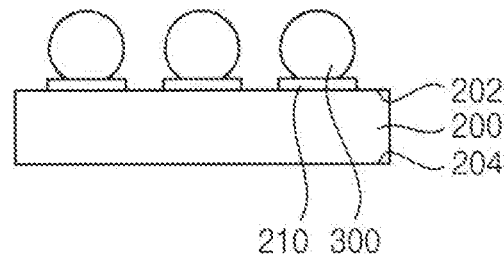

As illustrated in FIG. 8, a solder 300 may be formed on an electronic product 200. The electronic product 200 may include a semiconductor package or a semiconductor chip. According to example embodiments, the solder 300 may include only metal or metal compositions and the solder paste 130 may include a solder powder and a flux.

A plurality of input/output pads 210 may be formed on a first surface 202 of the electronic product 200. The solders 300 may be formed on the input/output pads 210 respectively. Although it is not illustrated in the figures, UBM (Under Bump Metallurgy) may be formed on the input/output pads 210, and then, the solder 300 may be formed on the UBM.

Figure 9:
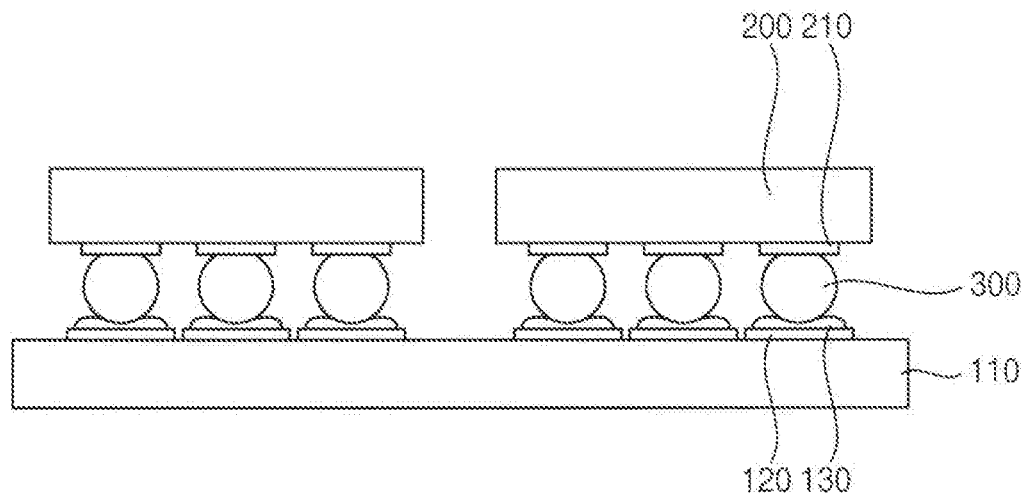

As illustrated in FIG. 9, the electronic product 200 may be disposed on the substrate 110 such that the solder 300 is interposed between the input/output pad 210 of the electronic product 200 and the solder paste 130. A plurality of the electronic products 200 may be stacked on the substrate 110.

Then, while the substrate 110 having the electronic products 200 moves sequentially through first to third heating chambers 30, 32, 34 of the solder reflow apparatus 10 of FIG. 1, a microwave may be generated toward the solder paste 130 within each of the heating chambers to heat the solder paste 130 (S120), and then, a phase of the microwave may be changed during reflow stage of the reflow process of the solder 300 to form a solder bump 310 between the substrate pad 120 and the input/output pad 210. For example, first and second heating chambers 30, 32 of the first to third heating chambers 30, 32, 34 may be used as a pre-heating chamber during pre-heating stages of the reflow process of the solder 300, and the third heating chamber 34 may be used as a reflow heating chamber during the reflow stage of the reflow process of the solder 300.

According to example embodiments, the first microwave device 40 installed in the first heating chamber 30 may output a first microwave having a first power to pre-heat the solder paste 130 to a first temperature during a first pre-heating stage of the reflow process of the solder 300. The second microwave device 42 installed in the second heating chamber 32 may output a second microwave having a second power greater than the first power to pre-heat the solder paste 130 to a second temperature greater than the first temperature during a second pre-heating stage of the reflow process of the solder 300. The third microwave device 44 installed in the third heating chamber 34 may output a third microwave having a third power greater than the second power to heat the solder paste 130 to a third temperature greater than the second temperature.

In some embodiments, a phase of the first microwave may be changed in stages or continuously by shifting the phase of the first microwave at a predetermined phase shift value per unit time to pre-heat the solder paste 130 during the first pre-heating stage of the reflow process of the solder 300, a phase of the second microwave may be changed in stages or continuously by shifting the phase of the second microwave at a predetermined phase shift value per unit time to pre-heat the solder paste 130 during the second pre-heating stage of the reflow process of the solder 300, and a phase of the third microwave may be changed in stages or continuously by shifting the phase of the third microwave at a predetermined phase shift value per unit time to heat the solder paste 130 during the reflow stage of the reflow process of the solder 300. Heating of the solder paste 130 in the third heating chamber 34 by using the phase-shifted third microwave causes the solder 300 to reflow, thereby forming the solder bump 310 between the substrate pad 120 and the input/output pad 210. According to exemplary embodiments, phase-shifted microwaves are used within the first to third heating chambers 30, 32, 34, to uniformly generate heat toward the solder paste 130 and the solder 300 within each heating chamber. In some embodiments, the substrate 110 may be moved in a first direction while the microwave is generated by each microwave generator 50.

Figure 10:
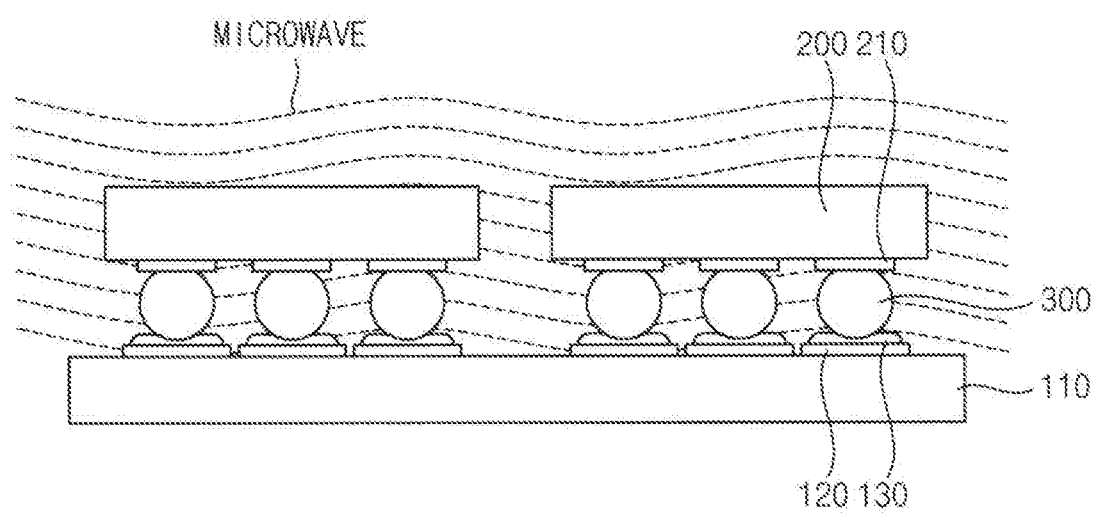
Figure 11:
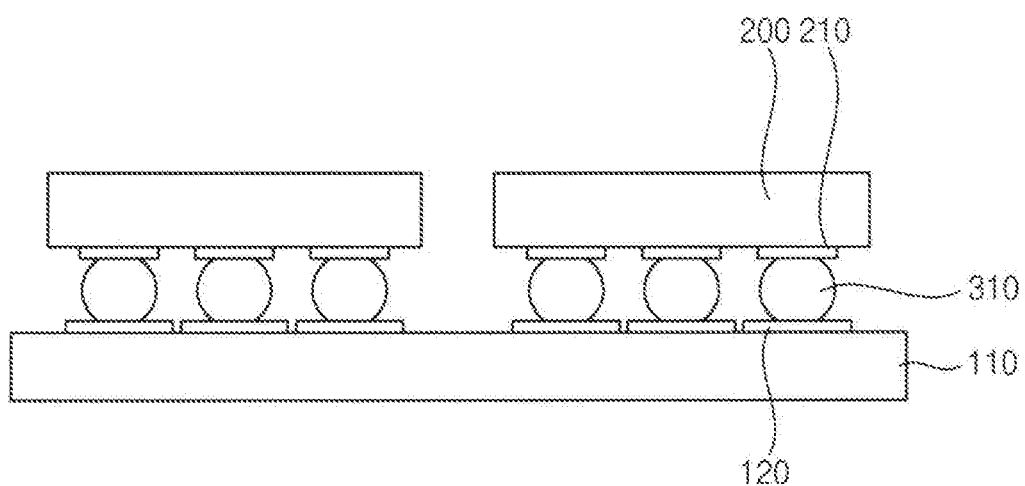

As illustrated in FIGS. 10 and 11, a microwave device in each of the heating chambers may generate a microwave, and may change a phase of the generated microwave to output a phase-shifted microwave.

The phase-shifted microwave may have a predetermined frequency. The frequency of the phase-shifted microwave may range from about 1 GHz to about 40 GHz. For example, the frequency of the phase-shifted microwave may be about 2.45 GHz. The phase-shifted microwave may have a predetermined power. The power of the microwave may range from about 100 W to about 6 kW, preferably, from about 100 W to about 3 kW.

The phase of the outputting microwave may be shifted during the reflow process. The phase of the phase-shifted microwave may be shifted at a predetermined phase shift value per unit time ($\Delta\varphi/s$). For example, the predetermined phase shift value per unit time ($\Delta\varphi/s$) may be at least $\pi/3$ rad/s. The phase shift value per unit time ($\Delta\varphi/s$) may be determined in consideration of spacing between the solders 300, a dielectric constant, etc. The phase of the phase-shifted microwave may be changed over time in stages or continuously. The flux of the solder paste 130 as the dielectric may be selectively heated by the phase-shifted microwave, and then, the solder 300 may be molten to form the solder bump 310 between the substrate pad 120 pad and the input/output pad 210, to thereby mechanically and electrically connect the substrate pad 120 and the input/output pad 210.

Because only the solder paste 130 is selectively heated by the phase-shifted microwave, the substrate 110 and the electronic product 200 may be heated to a temperature about 100° C. less than the heating temperature of the solder paste 130. Accordingly, a heat deterioration failure may be prevented without using a low melting point solder, and heat vulnerable device and material may be used to decrease product costs.

In example embodiments, the substrate may be loaded sequentially into a plurality of the heating chambers arrange in-line, to thereby obtaining a desired temperature profile.

In particular, first and second heating chambers 30, 32 of the first to third heating chambers 30, 32, 34 may be used as a pre-heating chamber, and the third heating chamber 34 may be used as a reflow heating chamber.

A first microwave device 40 may output a microwave having a first power to pre-heat the solder paste 130 to a first temperature, and a second microwave device 42 may output a microwave having a second power greater than the first power to pre-heat the solder paste 130 to a second temperature greater than the first temperature, and a third microwave device 44 may output a microwave having a third power greater than the second power to heat the solder paste 130 to a third temperature greater than the second temperature, to thereby perform the reflow process. For example, the third temperature may range from about 240° C. to about 260° C.

The solder reflow apparatus 10 may further include a cooling chamber (not shown) adjacent to the third heating chamber 34. The cooling chamber may be maintained under a temperature less than the third temperature, to complete the reflow process.

The above-mentioned method may be iterated to manufacture semiconductor packages including logic devices and memory devices and semiconductor modules including the same. For example, the semiconductor package may include logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method of manufacturing an electronic device, comprising:
coating a solder paste on a substrate pad of a substrate, wherein the substrate pad is provided on a top surface of the substrate;
disposing, after the coating the solder paste on the substrate, an electronic product with a solder ball on the substrate such that the solder ball contacts the solder paste, wherein the electronic product includes an input/output pad on a bottom surface of the electronic product;
generating a first microwave toward the solder paste during a reflow stage to heat the solder paste; and
changing a phase of the first microwave during the reflow stage,
wherein heating of the solder paste causes the solder ball to reflow, thereby forming a solder bump between the substrate pad and the input/output pad, and
wherein the solder bump is confined in a region between the bottom surface of the electronic product and the top surface of the substrate,
wherein the first microwave has a first power to heat the solder paste to a first temperature,
wherein prior to generating the first microwave the method further comprises:
generating a second microwave having a second power to pre-heat the solder paste to a second temperature; and
generating a third microwave having a third power greater than the second power to pre-heat the solder paste to a third temperature greater than the second temperature, and
wherein the first power is greater than the third power and the first temperature is greater than the third temperature.

2. The method of claim 1,
wherein the first microwave has a predetermined frequency.

3. The method of claim 1,
wherein the first microwave has a predetermined power.

4. The method of claim 1,
wherein changing the phase of the first microwave comprises shifting the phase continuously or in stages at a predetermined phase shift value per unit time.

5. The method of claim 4,
wherein the predetermined phase shift value per unit time is at least $\pi/3$ rad/s.

6. The method of claim 1,
wherein generating the second microwave having the second power comprises heating the solder paste within a first heating chamber, and generating the third microwave having the third power comprises heating the solder paste within a second heating chamber.

7. The method of claim 6,
wherein generating the first microwave having the first power comprises heating the solder paste within a third heating chamber.

8. The method of claim 1, further comprising:
moving the substrate in a first direction while generating the first microwave.

9. The method of claim 1,
wherein the electronic product comprises a semiconductor chip or a semiconductor package, and the substrate comprises a module substrate or a package substrate.

10. A method of manufacturing an electronic device, comprising:
coating a solder paste on a plurality of substrate pads of a substrate;
forming a plurality of solder balls on a plurality of input/output pads of an electronic product respectively;
disposing, after the coating of the solder paste on the plurality of substrate pads, the electronic product on the substrate such that the plurality of solder balls are interposed between the plurality of input/output pads and the solder paste;
generating a first microwave toward the solder paste during a reflow stage to heat the solder paste; and
changing a phase of the first microwave during the reflow stage,
wherein heating of the solder paste causes the plurality of solder balls to reflow, thereby forming a plurality of solder bumps between the plurality of substrate pads and the plurality of input/output pads, and
wherein the plurality of solder bumps are confined to a region between a bottom surface of the electronic product and a top surface of the substrate,
wherein the first microwave has a first power to heat the solder paste to a first temperature,
wherein prior to generating the first microwave the method further comprises:
generating a second microwave having a second power to pre-heat the solder paste to a second temperature; and
generating a third microwave having a third power greater than the second power to pre-heat the solder paste to a third temperature greater than the second temperature, and
wherein the first power is greater than the third power and the first temperature is greater than the third temperature.

11. The method of claim 10,
wherein changing the phase of the first microwave comprises shifting the phase continuously or in stages at a predetermined phase shift value per unit time.

12. The method of claim 10,
wherein generating the second microwave having the second power comprises heating the solder paste within a first heating chamber, and generating the third microwave having the third power comprises heating the solder paste within a second heating chamber.

13. The method of claim 10, further comprising moving the substrate in a first direction while generating the first microwave.

14. A method of manufacturing an electronic device, comprising:
coating a solder paste on a substrate pad of a substrate;
disposing, after the coating of the solder paste on the substrate pad of the substrate, an electronic product on the substrate such that a solder ball on an input/output pad of the electronic product contacts the solder paste;
generating a first microwave toward the solder paste during a preheat stage to pre-heat the solder paste;
generating a second microwave toward the solder paste during a reflow stage to heat the solder paste; and changing a phase of the second microwave during the reflow stage, wherein heating of the solder paste during the reflow stage causes the solder ball to reflow, thereby forming a solder bump between the substrate pad and the input/output pad, and wherein the solder bump is confined to a region between a bottom surface of the electronic product and a top surface of the substrate, wherein the first microwave has a first power to pre-heat the solder paste to a first temperature, wherein the second microwave has a second power greater than the first power to heat the solder paste to a second temperature greater than the first temperature, and prior to generating the first microwave, generating a third microwave toward the solder paste during the preheat stage to pre-heat the solder paste, and wherein the third microwave has a third power lower than the first power to pre-heat the solder paste to a third temperature lower than the first temperature.

15. The method of claim 14, wherein changing the phase of the second microwave comprises shifting the phase of the second microwave continuously or in stages at a predetermined phase shift value per unit time.

16. The method of claim 14, further comprising:

moving the substrate in a first direction while generating the first and second microwaves.

* * * * *